United States Patent [19]

Roback et al.

[11] Patent Number: 4,851,966
[45] Date of Patent: Jul. 25, 1989

[54] METHOD AND APPARATUS OF PRINTED CIRCUIT BOARD ASSEMBLY WITH OPTIMAL PLACEMENT OF COMPONENTS

[75] Inventors: Kenneth J. Roback, Arlington Heights; Thomas R. Beise, Hoffman Estates, both of Ill.

[73] Assignee: Motorola, Inc., Schaumburg, Ill.

[21] Appl. No.: 929,113

[22] Filed: Nov. 10, 1986

[51] Int. Cl.$^4$ .............................................. H05K 1/18
[52] U.S. Cl. ................................ 361/406; 228/180.2; 228/56.3
[58] Field of Search ..................... 228/180.2, 56.3; 361/403, 406

[56] References Cited

U.S. PATENT DOCUMENTS

| | | | |
|---|---|---|---|
| 3,214,827 | 11/1965 | Phohofsky | 29/155 |
| 3,429,040 | 2/1969 | Miller | 29/626 |
| 3,495,133 | 2/1970 | Miller | 317/101 |
| 3,610,811 | 10/1971 | O'Keefe | 174/68.5 |
| 3,770,874 | 11/1973 | Krieger et al. | 174/68.5 |
| 3,778,530 | 12/1973 | Reimann | 174/68.5 |
| 3,786,172 | 1/1974 | Conley | 361/406 |
| 3,887,760 | 6/1975 | Krieger et al. | 174/68.5 |
| 3,982,979 | 9/1976 | Hentz et al. | 156/73.6 |
| 3,991,347 | 11/1976 | Hollyday | 361/406 |
| 4,139,881 | 2/1979 | Shimizu et al. | 361/400 |
| 4,164,778 | 8/1979 | Sawairi et al. | 361/409 |
| 4,339,785 | 7/1982 | Ohsawa | 361/411 |
| 4,372,475 | 2/1983 | Goforth et al. | 228/170 |
| 4,373,655 | 2/1983 | McKenzie, Jr. | 228/180 |
| 4,413,309 | 11/1983 | Takahashi et al. | 361/406 |
| 4,423,467 | 12/1983 | Shaheen | 361/403 |
| 4,512,509 | 4/1985 | Ellis, Jr. et al. | 228/180 |
| 4,565,314 | 1/1986 | Scholz | 228/180 |
| 4,605,153 | 8/1986 | Van Den Brekel et al. | 228/56.3 |
| 4,641,227 | 2/1987 | Denfiny et al. | 361/403 |
| 4,645,114 | 2/1987 | Van Den Brekel et al. | 228/56.3 |

FOREIGN PATENT DOCUMENTS

| | | | |
|---|---|---|---|
| 0175123 | 6/1954 | Fed. Rep. of Germany | 228/56.3 |
| 2032939 | 1/1972 | Fed. Rep. of Germany | 228/56.3 |

*Primary Examiner*—Nicholas P. Godici
*Assistant Examiner*—Karen Skillman
*Attorney, Agent, or Firm*—Donald B. Southard; Anthony J. Sarli, Jr.

[57] ABSTRACT

Method and apparatus are disclosed for printed circuit board assembly wherein optimal placement of components are effected. Components, such as microminiature components, are placed, at least on the underside of the circuit board, whereby specially contoured solder pads effect a self-alignment of such components prior to their being affixed in place by a suitable adhesive material.

6 Claims, 3 Drawing Sheets

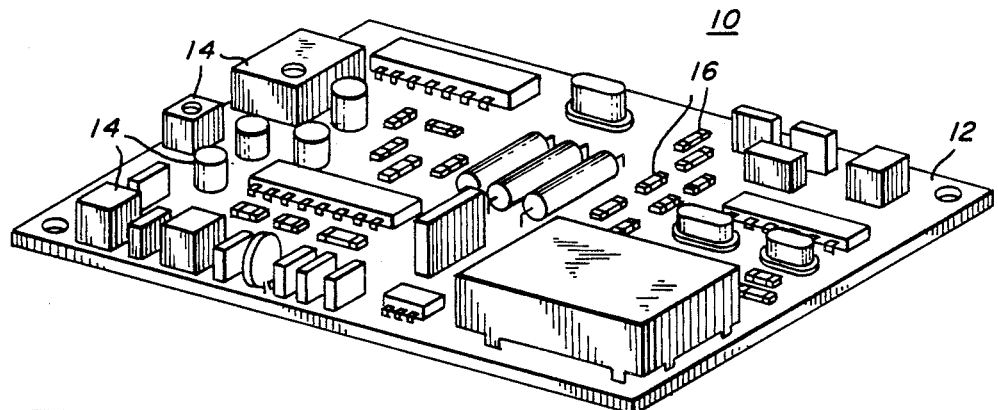
FIG. 1
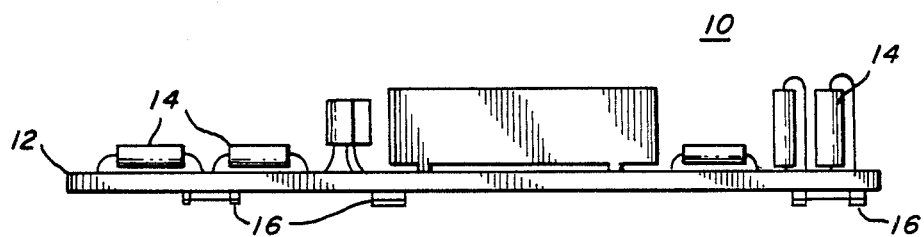
FIG. 2
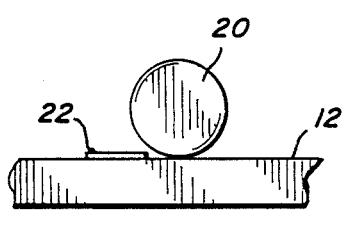 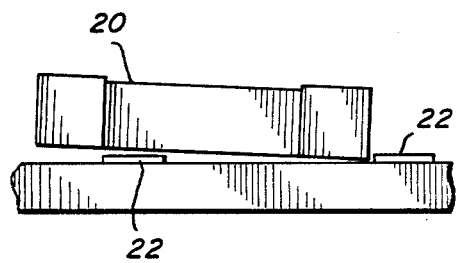
FIG. 3A  FIG. 3B

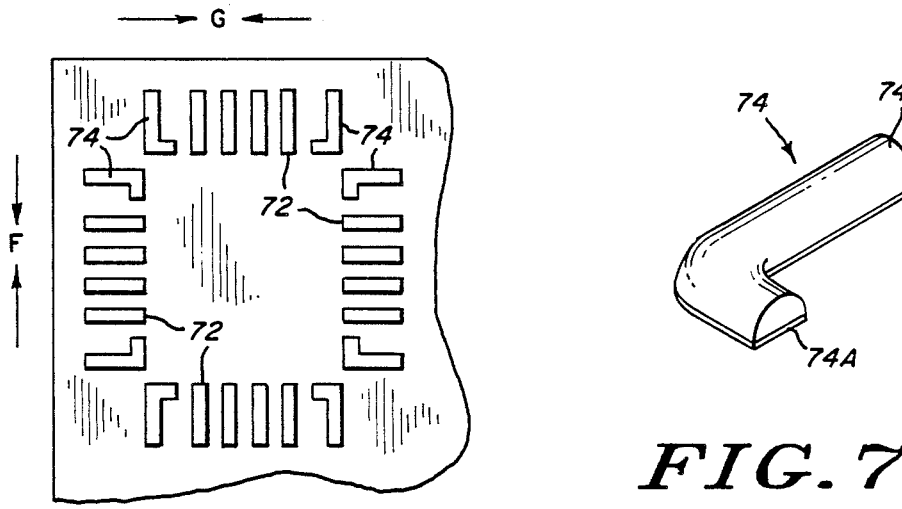
FIG. 7A
FIG. 7B
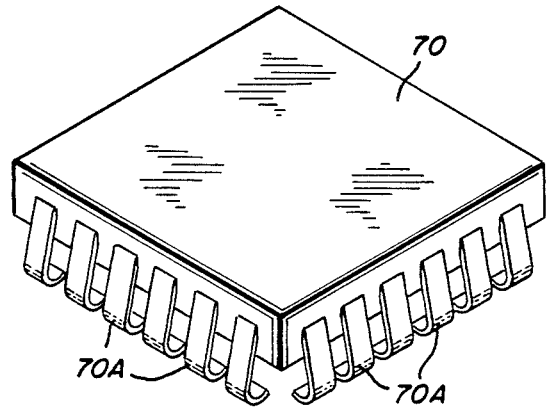
FIG. 8
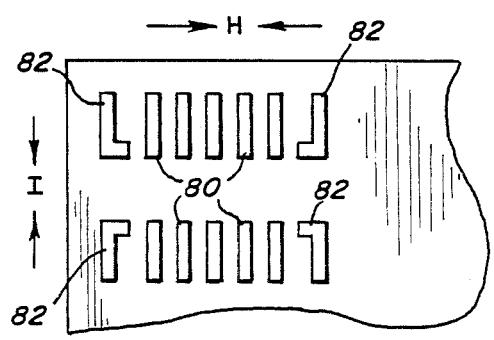
FIG. 9

METHOD AND APPARATUS OF PRINTED CIRCUIT BOARD ASSEMBLY WITH OPTIMAL PLACEMENT OF COMPONENTS

BACKGROUND OF THE INVENTION

The present invention relates in general to printed circuit board arrangements and more particularly to an improved method and apparatus for automatically positioning and soldering highly miniaturized components on a printed circuit board wherein such components are optimally located.

Present day electronic circuitry is characterized more and more by its high density in an extremely compact, low volume packaging configuration. Efforts to continually increase the density and/or decrease the circuitry volume has resulted in smaller and smaller components to the point that some, such as resistors, capacitors and diodes and the like measure but a few millimeters in length and not much more than a millimeter in width. Handling these ultraminiaturized components is all but impossible by hand. Placement thereof on associated circuit boards is best effected by automatic placement machinery. Even here, however, the margin or error in positioning the same is extremely narrow because of the size of the components and problems in misplacement are common.

Some solutions for these misplaced microminiature components have been effected in prior arrangements. Notably, the most common approach has been a self correcting feature for these components during the soldering phase. That is, means are provided for shifting the component to its more optimum placement position during a softening or reflow of the pre-applied solder paste. However, this technique presupposes the microminiaturized components are positioned on top of the associated circuit board and are free to shift or move to a final position before the hardening of the reflow solder material Such techniques cannot provide satisfactory results for those miniature components positioned on the bottom surface of the circuit board during the final soldering step. If such components were free to move, they would simply fall off by reason of gravity or other forces at work.

There are, of course, circuit board assembly techniques that are known in the art which contemplate positioning and retention of components, microminiature or otherwise, on the bottom surface of the circuit board before final soldering. Reference is made to U.S. Pat. No. 4,139,881, issued February 1979. However, that patent is directed to a degaussing procedure for such components. It does not in any way address the problem of misplaced components which may cause short circuits or related failures.

Accordingly, what is needed is an arrangement which will permit the placement of components, microminiature or otherwise, on both sides of the printed circuit board, which will permit and accommodate a final soldering step, may it be reflow or waveline soldering or a combination of both, and wherein the position of such components will be at their optimized locations at least after final assembly has been effected.

SUMMARY OF THE INVENTION

It is an object of the present invention to provide method and apparatus in a circuit board arrangement which overcomes the foregoing deficiencies.

A more particularized object of the present invention is to provide such method and apparatus of the foregoing type wherein microminiature components may be placed on the top and bottom surfaces of an associated printed circuit board prior to final soldering and wherein such placed components will be optimally positioned in their final location.

In practicing the invention an improved printed circuit board arrangement is provided having a plurality of components interconnected thereon among which are microminiaturized components on both sides of the circuit board which have been optimally located and retained. The optimal location is effected by soldering lugs at least on the underside of the circuit board, which when microminiature components are placed thereon, act to effect a self alignment of such components to their optimal locations prior to affixing the same by adhesive to the circuit board and later subjecting the board to waveline soldering.

An improved method of assembling the referenced printed circuit board arrangement is also contemplated by the present invention. In the preferred arrangement, solder paste is first applied to the top side of the circuit board before associated microminiature components are selectively placed thereon Reflow soldering is effected during which any misaligned components will be corrected. Next, additional microminiature components are selectively placed on the underside of the circuit board, self aligned thereon by specially contoured soldering pads, and then affixed in place as by adhesive. Finally, those components requiring thru holes are inserted on the circuit board before the board is then subjected to waveline soldering to complete its assemblage.

BRIEF DESCRIPTION OF THE DRAWINGS

The features of the present invention which are believed to be novel are set forth with particularity in the appended claims. The invention itself, however, together with further object and vantage thereof, may be best understood by reference to the following description when taken in conjunction with the accompanying drawings, in which:

FIG. 1 is a view in perspective of a typical printed circuit board with components arranged thereon;

FIG. 2 is a side view of the circuit board of FIG. 1 showing components on both surfaces of the printed circuit board;

FIG. 3a is an enlarged fragmentary view of a component misaligned on its associated soldering pad;

FIG. 3b is a side view of a component misaligned with respect to its associated soldering pads;

FIG. 7a is a plan view of a soldering pad arrangement suitable for accommodating a quad package component;

FIG. 7b is an enlarged view of one of the L-shaped soldering pads included in FIG. 7a;

FIG. 8 is a view in perspective of a quad package component suitable for use with the soldering pad arrangement in FIG. 7a; and FIG. 9 is a plan view of soldering pad arrangement suitable for accommodating a small outline integrated circuit (SOIC).

DESCRIPTION OF THE PREFERRED EMBODIMENTS

Figure 4:
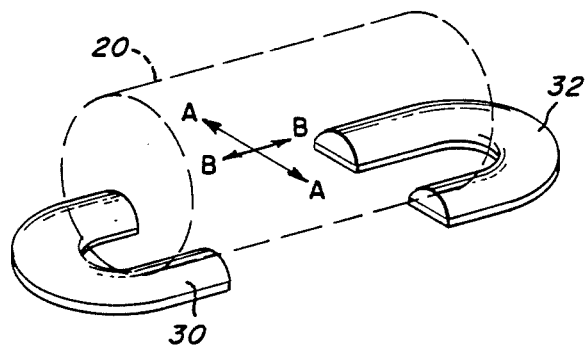
FIG. 4 is an enlarged fragmentary view showing soldering pads which have been constructed in accordance with the present invention which provide a self alignment feature for a component in association therewith.

Referring now to the drawings, a typical printed circuit board arrangement 10 is shown in FIGS. 1 and 2 complete with its assembled components and interconnections. Such arrangement includes a printed circuit board 12 of conventional type having a dielectric substrate on which suitable conductive leads are included. Several types of components are contemplated for inclusion thereon, namely, those that include leads such as those indicated at 14 which require through holes in the printed circuit board itself, and the leadless, microminiature components, such as those indicated at 16. As illustrated, the microminiature components may be included on both the top surface as well as the underside of the circuit board 12 for improved circuit density. These components 14 and 16 are suitably placed on respective circuit board surfaces and soldered in place, either by reflow solder techniques, or by waveline soldering, or a combination of both.

These components, particularly the leadless microminiature components 16, are of such a small size, that they are best handled by automatic placement machinery (not shown), well known in the art. Moreover, those microminiature components located on the underside of the circuit board 12 must be placed and then physically attached to the board, by using a suitable form of adhesive, also known in the art.

In placing components on the circuit board 12, particularly the leadless microminiature components 16, mislocations and misalignments frequently occur. Many factors contribute The small size obviously is a significant contributing factor, but also playing a part is the limitations of the placement of machinery itself. Other factors will come to mind upon reflection. Due to the density of the circuitry, these misalignments or locations lead to circuit malfunction and failure by reason of short circuits they generate. The referenced mislocations are depicted graphically in FIGS. 3a and 3b. Shown in FIG. 3a is a microminiature diode 20 which has been misaligned with its intended soldering pad at terminal 22. That is, it is located to the right of its intended location, viewing FIG. 3a, on pad 22. FIG. 3b illustrates still another misplacement possibility for component 20. In this case, diode 20 has been mislocated to the extent that one of its connecting terminals, say the forward end, falls short of making appropriate contact with its intended solder pad 22.

This misalignment problem is particularly acute for those instances in which the microminiature components, such as diode 20, is placed on the underside of the printed circuit board 12. Usually such components are soldered in place subsequent to the placement of the same on the top side of the board which requires through holes. The circuit board so assembled conventionally is run through a waveline soldering complex where the components with the leads extending in the associated through holes along with the microminiature components physically located on the underside of the board are soldered in place. This means that such microminiature components not only must be placed on the under-side of the board but must be glued or otherwise affixed to the surface thereof so as not to fall off during the remaining steps in the assembly procedure for the circuit board, including the waveline soldering operation. Placement of those microminiature components on the top side of the board are not nearly so critical in their initial placement since they need not be glued or affixed to the board itself, but are free to move during the solder process. Accordingly, mislocated and misaligned components are correctable subsequent to initial placement on the top side of the circuit board, while such is not the case for those components carried on the underside of the board.

Such misalignment problems have been efficiently and effectively solved in accordance with the present invention. The components in question are effectively aligned by the associated pad pattern during their initial placement. This will be made more apparent by reference to FIG. 4. The diode 20, used as an example previously, is shown here in dotted line and is indicated as resting on a pair of associated solder pad terminals 30 and 32. Solder pad terminals are horse-shoe shaped, although it is to be understood that the invention is not to be limited to that or any other particular pattern shape. The solder pads 30 and 32 are contoured in the manner shown so that the component such as the diode 20, when placed thereon will self-align. That is, the contour surfaces of the solder pad terminals will move the component, such as diode 20, so that it is centered within the confines of the interior surface outline of the solder pads as illustrated. Such components may be adjusted in alignment along the direction A-A, as well as B-B, or combination of both.

Figure 5A:
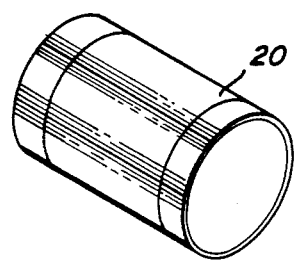
FIG. 5a is a view in perspective of a microminiature diode.
Figure 5B:
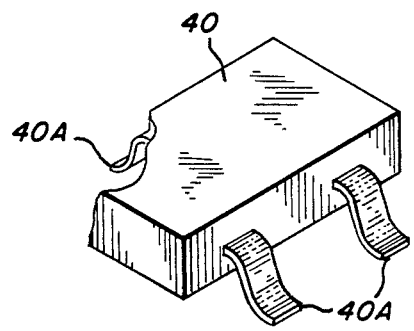
FIG. 5b is view in perspective of a small outline transistor (SOT)
Figure 5C:
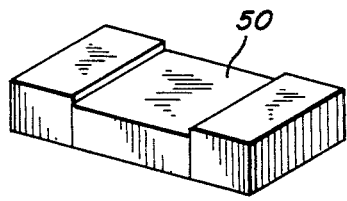
FIG. 5c is a view in perspective of a microminiature capacitor/resistor.

It should be understood that the automatic alignment feature is not limited to just diode microminiature components, but indeed may be advantageously employed with a wide variety of components of different configurations. FIGS. 5a through 5c illustrate but a few of such miniaturized components that are fully accommodated in the present invention. FIG. 5a represents the cylindrical shape diode indicated at 20 and previously used as an example. FIG. 5b is a rectangular shaped small outline transistor (commonly referred to as a SOT). A SOT 40 includes electrodes 40a extending therefrom. FIG. 5c is a rectangular shaped components that can be either a capacitor or a resistor. Still other such components are available and utilizable in the present invention, but not specifically shown here.

Figure 6:
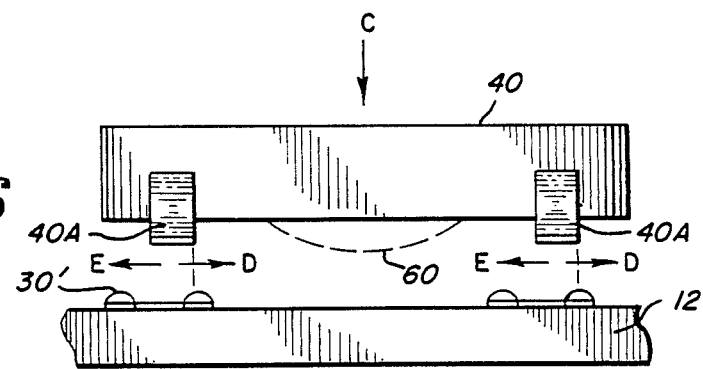
FIG. 6 is an enlarged fragmentary view of a SOT of FIG. 5b being placed on a circuit board which includes a self-alignment action by the soldering pads constructed in accordance with the present invention.

FIG. 6c illustrates the alignment corrective action that may be obtained for a SOT such as shown at 40, in conjunction with the contoured solder pad terminals 30' and 32'. As the SOT 40 is placed on the circuit board, in the direction C, its terminals or electrodes 40a make contact with the solder pads 30' and 32'. The examples shown in FIG. 6 assumes for purposes of illustration that there is a mislocation in the direction of D. As the terminals 40a contact solder pads 30' and 32', the contoured surfaces thereof cause the SOT 40 to move in the direction E to a point where the terminals 40a are centered within the pads 30' and 32'. Component 40 is then affixed to circuit board 12, such as by a drop of adhesive, as illustrated. It is to be understood that the adhesive 60 may be applied first to the component 40, as shown, or put on the circuit board 12 before the placement of component 40 thereon. Either way provides satisfactory results.

It is also to be noted that the present invention is not limited to just microminiature components per se. In point of fact, it is suitable for use with any surface mount component. An example is shown in FIG. 8 which depicts a surface mount component 70, referred to as a quad pack. J-shaped legs 70a are positioned around its periphery on all four sides. The legs 70a curve under and are intended to rest on the surface of the associated printed circuit board and not to extend into through holes. The bonding pattern for such component as shown in FIG. 7a. In accordance with the present invention, the solder pad arrangement may include conventional solder pads 72, with contoured L-shaped solder pads 74 located at the corners thereof. These contoured solder pads cause the same alignment action for the component legs as described for the contoured horse-shoe shaped pads 30, 30' and 32, 32'. That is, movement, if needed, is effected in both the F and G directions for the component 70 by the contoured surfaces of the end placed solder pads 74.

Still other surface mount components may be accommodated. One such is the small outline IC (SOIC), not specifically shown. It is similar to the illustrated quad pack 70, but has leads only along two sides of the housing package. For that reason, only two rows of solder pads are necessary, as shown in FIG. 9 at 80 and 82. Solder pads 82 on the ends are similar to that depicted in FIG. 7a and 7b for solder pad 74 and provides the necessary movement in the H and I directions. That is, the inner portion of the longer side of solder pads 82 will force a movement, if needed, in the H direction and the inner portion of the shorter side will force any needed movement in the I direction.

The contoured solder pads contemplated by the present invention may be constructed in any suitable way. One such method found to provide satisfactory results is to provide conventional copper conductive plating, such as shown at 74a in FIG. 7b. This copper plating layer may be on the order of 0.0013 inches thick. The board may be dipped in molten solder, the excess of which is removed from the surface by an air knife or other suitable implement. What is left is a dome shaped deposit of solder 74b on the solder pad substantially as depicted in FIG. 7b. It will, of course, be understood that the foregoing applies equally well to the formation of solder pad terminals 30, 30' and 32, 32'.

In the preferred mode of assembly for the circuit board 12, solder paste may first be applied to the top side of the board, after which associated microminiature components may be selectively placed thereon. The solder is then reflowed, during which any misalignment in such components may be suitably corrected. Next, additional microminiature components may be selectively placed on the underside of circuit board 12, self-aligned by the associated contoured solder pads 30, 30' and 32, 32', and then affixed in place by a suitable adhesive material. Those components having leads and requiring thru holes in the circuit board may be put in place and the entire board then subjected to a waveline soldering process to complete the assembly thereof. It should be noted, however, that there is no particular order required for the steps above enumerated to effectively practice the invention. The components for the underside of the circuit board could have as well been placed first before those in the topside of the board. Hand placement of components may be utilized as well as automatic machine placement, although the former is not nearly as effective as the latter.

Accordingly, an improved apparatus and method has been described for the placement of surface mount component which is particularly effective in ensuring the optimal location of such components placed on the underside of an associated circuit board, and which are held in place by a form of adhesive during a subsequent waveline soldering operation. If a deviation in location does occur during placement, the associated solder pads aid in correcting the misalignment thereby preventing adhesive smear which may otherwise prohibit proper soldering. It also helps prevent solder "splash" outside the solder pad pattern that could very well result in short circuits to adjacent parts.

What is claimed is:

1. A high density printed circuit board assembly having an arrangement of components thereon, including surface mounted microminiature components optimally located on respective sides of the circuit board, comprising;

a circuit board having a conductive pattern on both sides thereof for accommodating the associated components thereon, including soldering pads of a particularized shape at least on the under side of the circuit board that provide a self-alignment action for those surface mounted components placed thereon;

said soldering pads comprising a shaped base layer of conductive plating on which a contoured dome of solder is captivated to provide a three dimensional configuration, each of said soldering pads being precision located on said printed circuit board;

said printed circuit board having surface mounted microminiature components machine placed at least on the underside thereof, self-aligned both longitudinally and laterally by said particular shaped soldering pads and affixed to the circuit board by adhesive prior to soldering the assembled board.

2. A printed circuit board assembly in accordance with claim 1, wherein said contoured soldering pads are formed in a horse-shoe configuration.

3. A printed circuit board assembly in accordance with claim 1, wherein said contoured soldering pads are L-shaped.

4. A printed circuit board assembly in accordance with claim 1, wherein said conductive plating is copper.

5. A printed circuit board assembly in accordance with claim 1, wherein said microminiature components that may be accommodated include at least diodes, capacitors, resistors and small outlying components.

6. A printed circuit board assembly in accordance with claim 1, wherein said components that may be accommodated further include any surface mount components not requiring thru holes on the associated printed circuit board.

* * * * *